(12) United States Patent
Jang et al.

(10) Patent No.: US 9,111,850 B2
(45) Date of Patent: Aug. 18, 2015

(54) CHUCK AND SEMICONDUCTOR PROCESS USING THE SAME

(71) Applicant: UNITED MICROELECTRONICS CORPORATION, Hsinchu (TW)

(72) Inventors: Chung-Sung Jang, Kaohsiung (TW); Ming-Tse Lin, Hsinchu (TW); Yung-Chang Lin, Taichung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/670,440

(22) Filed: Mar. 27, 2015

(65) Prior Publication Data

US 2015/0200144 A1    Jul. 16, 2015

Related U.S. Application Data

(62) Division of application No. 13/600,231, filed on Aug. 31, 2012, now Pat. No. 9,022,392.

(51) Int. Cl.
*G03F 7/20* (2006.01)
*H01L 21/683* (2006.01)
*H01L 21/66* (2006.01)

(52) U.S. Cl.
CPC  *H01L 22/20* (2013.01); *G03F 7/20* (2013.01); *H01L 21/6836* (2013.01); *H01L 22/12* (2013.01)

(58) Field of Classification Search
CPC ..... H01L 21/6838; H01L 22/12; G03F 7/707; G03F 7/70783; G03F 7/20; Y10T 279/11
See application file for complete search history.

(56) References Cited

U.S. PATENT DOCUMENTS

| | | |
|---|---|---|
| 6,446,948 B1 | 9/2002 | Allen |
| 7,396,022 B1 | 7/2008 | Moghadam |
| 2002/0023590 A1 | 2/2002 | Storbeck |

OTHER PUBLICATIONS

Internal UMC Memo containing color photos to be submitted under confidential IDS or Proprietary, or Trade Secrets.

*Primary Examiner* — Brittany Raymond
(74) *Attorney, Agent, or Firm* — Ding Yu Tan

(57) ABSTRACT

A semiconductor process is described in this application. The process includes the following steps: providing a semiconductor substrate; measuring a warpage level of the semiconductor substrate; and holding the semiconductor substrate by providing at least one vacuum suction according to the warpage level, so that the semiconductor substrate is subjected to a plurality of varied suction intensities. The semiconductor substrate is held on a chuck having a plurality of holes grouped into a plurality of groups, and the sizes of the holes within different groups are different, wherein the sizes of the holes increase from a center toward an edge of the chuck, and the holes are arranged in a spiral.

12 Claims, 6 Drawing Sheets

CHUCK AND SEMICONDUCTOR PROCESS USING THE SAME

CROSS REFERENCE

The application is a division application of a U.S. patent application Ser. No. 13/600,231, filed on Aug. 31, 2012, currently pending, the disclosure of which is incorporated by reference herein in its entirety.

BACKGROUND

1. Technical Field

The present invention relates generally to semiconductor apparatus and process, and more particularly, to a chuck and a semiconductor process using the same.

2. Description of the Related Art

It is currently common to form a plurality of films on a wafer in a semiconductor process, so the wafer is subject to warpage because of the pressure or stress resulting from the films stacked thereon. On the contrary, the warping wafer would result in poor uniformity of the films subsequently formed on the wafer. Therefore, it is an important issue to reduce the degree of warpage of the wafer.

BRIEF SUMMARY

In accordance with one aspect of the present invention, an apparatus of semiconductor process including a chuck and a vacuum source is provided. The chuck has a plurality of holes for holding a semiconductor substrate and the vacuum source is used for providing vacuum suction through the holes to make the semiconductor substrate be subjected to varying suction intensities according to a warpage level thereof.

In some embodiments of the present invention, the holes are grouped into a plurality of groups, and the sizes of the holes within different groups are different.

In some embodiments of the present invention, each group of the holes is arranged as a ring, and the rings are concentric.

In some embodiments of the present invention, the sizes of the holes increase from a center toward an edge of the chuck.

In some embodiments of the present invention, the sizes of the holes decrease from a center toward an edge of the chuck.

In some embodiments of the present invention, the holes are arranged in a radial arrangement or a spiral arrangement.

In some embodiments of the present invention, the chuck has a first warpage toward a first direction and the semiconductor substrate has a second warpage toward a second direction before being subjected to the varied suction intensities, and the second direction is opposite to the first direction.

In some embodiments of the present invention, wherein a radius of the chuck is smaller than that of the semiconductor substrate.

In some embodiments of the present invention, the holes have the same size.

In accordance with one aspect of the present invention, a semiconductor process including the following steps is provided. First, a semiconductor substrate is provided. Next, a warpage level of the semiconductor substrate is measured. Then, the semiconductor substrate is held by providing a vacuum suction according to the warpage level, so that the semiconductor substrate is subject to varied suction intensities.

In some embodiments of the present invention, the semiconductor substrate is held on a chuck having a plurality of holes with different sizes, and the vacuum suction is identically applied to the semiconductor substrate through the holes.

In some embodiments of the present invention, the semiconductor substrate is held on a chuck having a plurality of holes with the same size, and the vacuum suction is variedly applied to the semiconductor substrate through the holes.

In some embodiments of the present invention, the semiconductor substrate is placed on a chuck having a plurality of holes after measuring the warpage level of the semiconductor substrate.

In some embodiments of the present invention, the semiconductor substrate is placed on a chuck having a plurality of holes before measuring the warpage level of the semiconductor substrate.

In some embodiments of the present invention, the semiconductor process further includes performing a treatment process for the semiconductor substrate after providing the vacuum suction.

In some embodiments of the present invention, the treatment process includes photolithographic process, such as coating process, baking process and exposing process.

In accordance with the aforementioned apparatus of the semiconductor process, the chuck has a plurality of holes for holding the semiconductor substrate, and the vacuum source is used for providing vacuum suction through the holes to make the semiconductor substrate be subjected to varied suction intensities according to the warpage level thereof, so that the warpage of the semiconductor substrate can be eliminated. Therefore, the yield of the process of the semiconductor substrate performed as the semiconductor substrate placed on the chuck can be increased and the uniformity of the material layer formed on the semiconductor substrate may be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
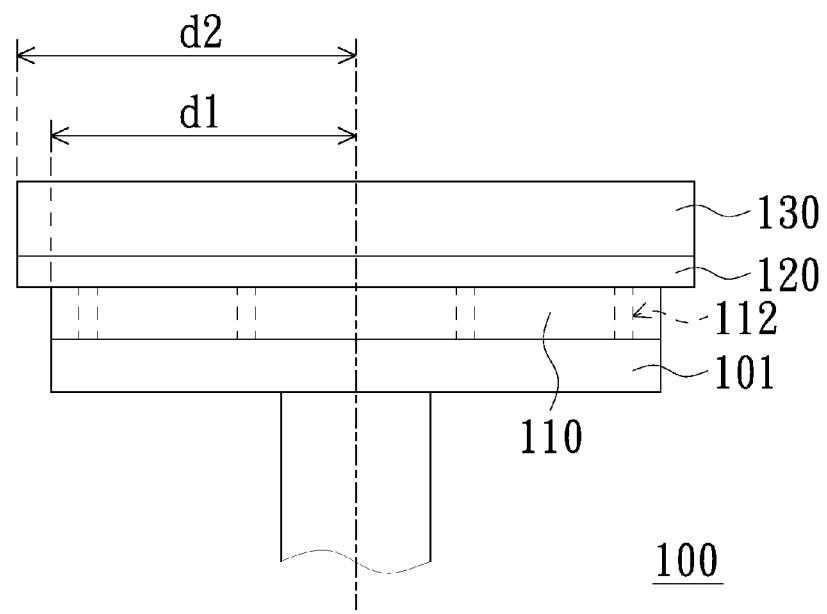
FIG. 1 is a cross-sectional schematic view illustrating a semiconductor substrate placed on a chuck in accordance with an embodiment of the invention.

FIG. 1 is a cross-sectional schematic view illustrating an apparatus of semiconductor process 100 in accordance with an embodiment of the invention. Referring to FIG. 1, the apparatus of semiconductor process 100 includes a chuck 110, which has a plurality of holes 112, and at least one vacuum source 101. For operation, a semiconductor substrate 120, such as a wafer, is placed and held on the chuck 110 by vacuum suction provided from the vacuum source 101 through the holes 112. In detail, the semiconductor substrate 120 can be subjected to varied suction intensities.

In this embodiment, the sizes of the holes 112, e.g. the radii of the holes 112 which are circular in this embodiment, are different. Specifically, the holes 112 are grouped into a plurality of groups and the sizes of the holes within different groups are different. Thus, the semiconductor substrate 120 can be subjected to different suction intensities corresponding to different regions of the chuck 110 under identical suction force, which is provided by the vacuum source 101, exerted through the holes 112 with or having different sizes.

Figure 2:
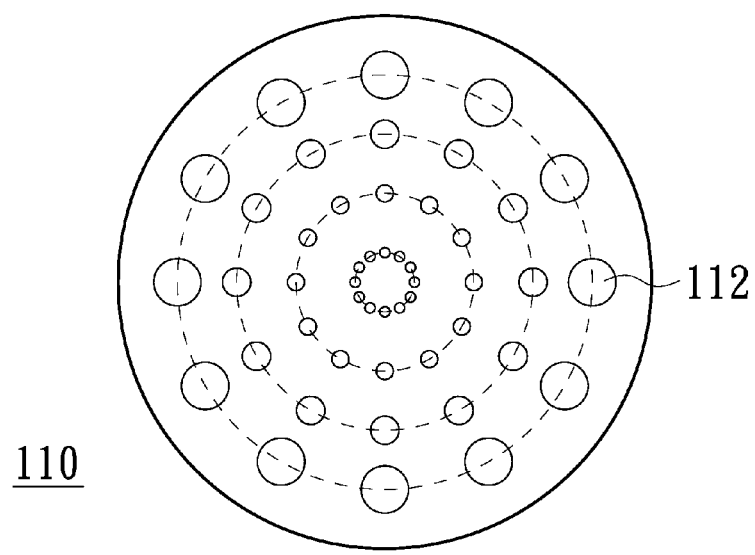
FIGS. 2 to 3 are top views respectively illustrating a chuck with a plurality of holes arranged in a radial arrangement in accordance with some embodiments of the invention.
Figure 3:
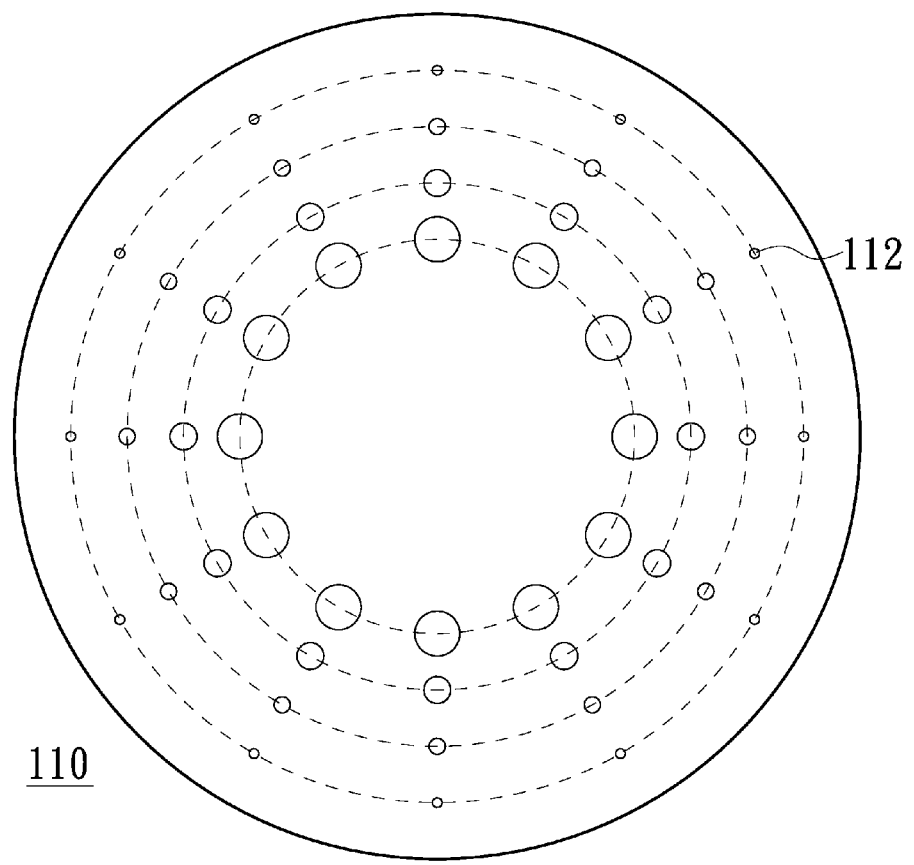

In this embodiment, as shown in FIGS. 2-3, each group of the holes 112, for example, is arranged as a ring, and the rings are concentric. Furthermore, the holes 112 which are arranged in the same ring have the same sizes, but the sizes of the holes 112 arranged in different rings are different. Specifically, the sizes of the holes 112 increase from a center toward an edge of the chuck 110, as shown in FIG. 2. Therefore, when the vacuum source 101 provides an identical vacuum suction through the (whole) holes 112 to the semiconductor substrate 120, radially outer portions of semiconductor substrate 120 can be subjected to greater suction intensity because of the holes 112 located therein such outer portions having greater sizes. Accordingly, for the semiconductor substrate 120 having a sunken region at the center thereof before being placed on the chuck 110, the greater suction intensity applied to the radially outer portions of the semiconductor substrate 120 may flatten the semiconductor substrate 120.

In other embodiments, the sizes of the holes 112 may decrease from a center toward an edge of the chuck 110 (as shown in FIG. 3), so that when the identical vacuum suction is provided by the vacuum source 101 through the (whole) holes 112, radially inner portions of semiconductor substrate 120 can be subjected to greater suction intensity because of the holes 112 having greater sizes. Accordingly, for the semiconductor substrate 120 having a protrusion at the center thereof before being placed on the chuck 110, the greater suction intensity applied to the center of the semiconductor substrate 120 may flatten the semiconductor substrate 120. Thus, it can be seen that the variation of the sizes of the holes 112 is determined according to the warpage amount or level of the semiconductor substrate 120 before being placed on the chuck 110.

Figure 4A:
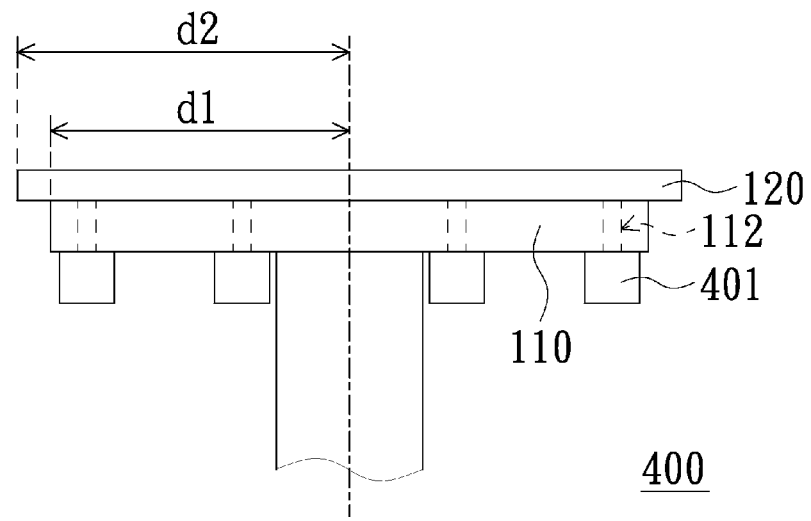
FIG. 4A is a cross-sectional schematic view illustrating a semiconductor substrate placed on a chuck in accordance with another embodiment of the invention.
Figure 4B:
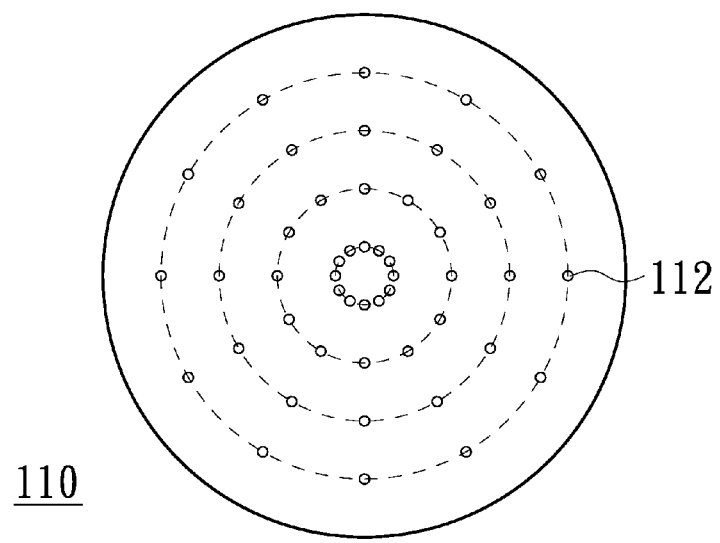
FIG. 4B is a top view illustrating the chuck shown in FIG. 4A.

FIG. 4A is a cross-sectional schematic view illustrating a semiconductor substrate placed on a chuck in accordance with another embodiment of the invention, and FIG. 4B is a top view illustrating the chuck shown in FIG. 4A. Referring to FIGS. 4A and 4B, although in the aforementioned embodiments, the chuck 110 has a plurality of holes 112 with different sizes, but the invention is not limited hereto. In other embodiments, the holes 112 may have the same size. Further, in this embodiment, an apparatus of semiconductor process 400 includes a plurality of vacuum sources 401 for providing different suction intensities, and different groups of the holes 112 correspond to different vacuum sources 401, respectively. Thus, the semiconductor substrate 120 in this embodiment also can be subjected to varied suction intensities corresponding to different regions thereof by using the chuck 110 having the holes 112 with the same size.

Figure 5:
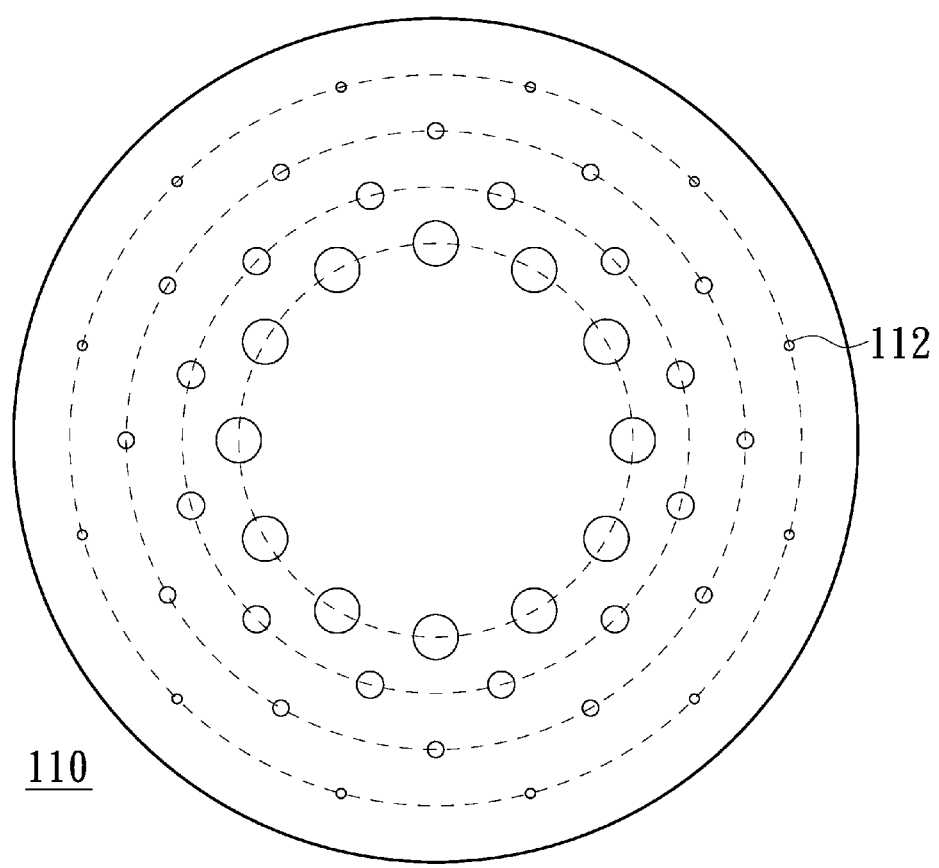
FIG. 5 is a top view illustrating a chuck with a plurality of holes arranged as a plurality of rings in accordance with some embodiments of the invention.

The holes 112 shown in FIGS. 2-3 and 4B are arranged orderly in one or more particular specified pattern along the radius direction of the chuck 110. That is, the holes 112 shown in FIGS. 2-3 and 4B are arranged in a radial arrangement. However, the invention is not limited hereto. In other embodiments, the holes 112 can be arranged in ring configuration but not orderly arranged in a linear pattern along the radius direction of the chuck 110, as shown in FIG. 5.

Figure 6:
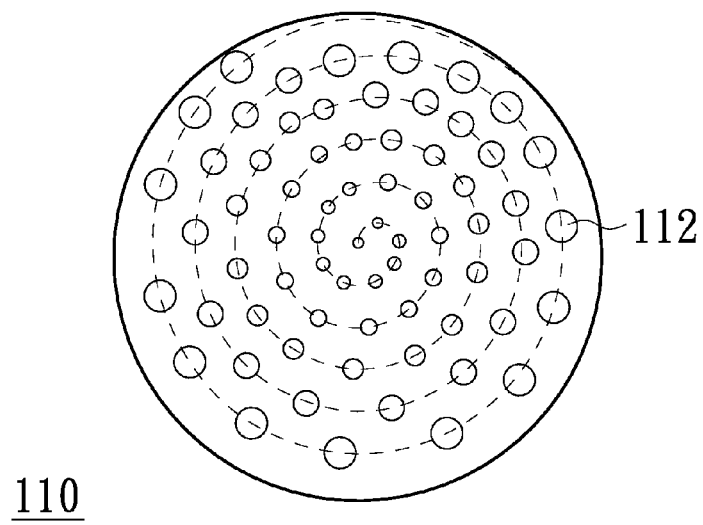
FIGS. 6 to 8 are top views respectively illustrating a chuck with a plurality of holes arranged in a spiral arrangement in accordance with other embodiments of the invention.
Figure 7:
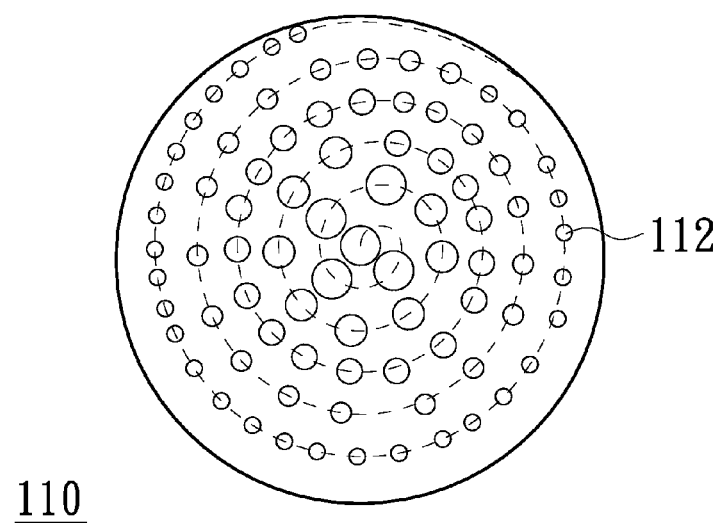
Figure 8:
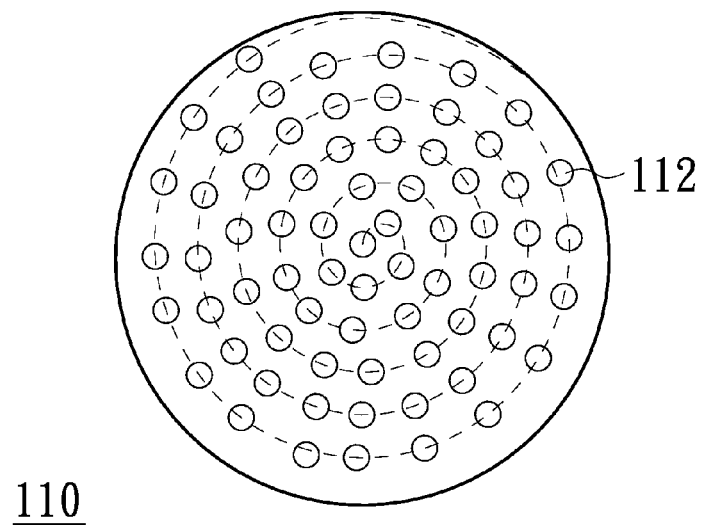

Moreover, the holes 112 also can be arranged in a spiral arrangement, as shown in FIGS. 6-8. Moreover, the sizes of the holes 112 not only can be different, such as becoming larger and larger (as shown in FIG. 6) or smaller and smaller (as shown in FIG. 7) from the center toward the edge of the chuck 110, but also can be the same, as shown in FIG. 8. The arrangement and dimensions of the holes 112 depend on the distribution and magnitude of vacuum suction needed for the semiconductor substrate 120.

Referring to FIG. 1 again, after placing the semiconductor substrate 120 on the chuck 110, a forming process can be performed to form a layer 130 on the semiconductor substrate 120. Specifically, the layer 130 is a, for example, photoresist layer. Accordingly, since the vacuum source 101 can provide vacuum suction through the holes 112 of the chuck 110 to the semiconductor substrate 120 for eliminating warpage of the semiconductor substrate 120, the layer 130 can be formed on the semiconductor substrate 120 uniformly, so that the film quality of the layer 130 can be improved.

In this embodiment, after forming the layer 130 on the semiconductor substrate 120 placed on the chuck 110, a photo-lithographic process, such as a baking process and an exposing process, can be performed in sequence. Since the chuck 110 can eliminate the warpage of the semiconductor substrate 120, the accuracy of the exposing process on the layer 130 can be enhanced.

Moreover, the chuck 110 has a first radius d1 and the semiconductor substrate 120 has a second radius d2 greater than the first radius d1 for facilitating the cleaning process of the semiconductor substrate 120. For example, the second radius d2 is greater than the first radius d1 at about 1 mm.

Figure 9:
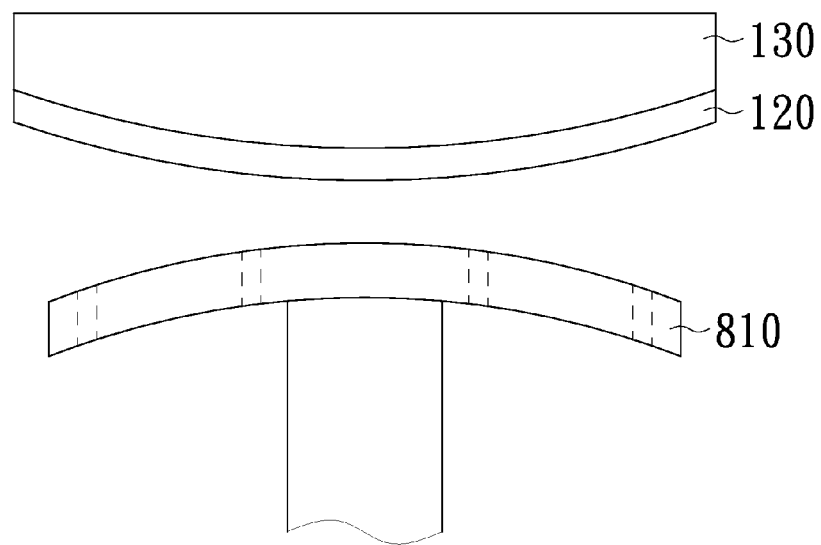
FIG. 9 is a cross-sectional schematic view illustrating a semiconductor substrate placed on a chuck in accordance with another embodiment of the invention.

FIG. 9 is a cross-sectional schematic view illustrating a semiconductor substrate 120 placed on a chuck 810 in accordance with another embodiment of the invention. Referring to FIG. 9, the chuck 810 is similar to the aforementioned chuck 110. That is, the chuck 810 has a plurality of holes 112 with the same size or different sizes. Further, the chuck 810 has a first warpage toward a first direction (i.e. the downward direction in the FIG. 9). Therefore, when the semiconductor substrate 120 with a second warpage toward a second direction (i.e. the upward direction in the FIG. 9) opposite to the first direction is placed on the chuck 810, the semiconductor substrate 120 can be flattened by the first warpage of the chuck 810 and the varied suction intensities applied through the holes 112 of the chuck 810. It should be noted that the first direction may be the upward direction in the FIG. 9 and the second direction may be the downward direction in the FIG. 9 in other embodiments, but the invention is not limited hereto.

Accordingly, the chuck 110 and the chuck 810 described in the aforementioned embodiment can improve the process yield of the semiconductor substrate 120 placed on the chuck 110 and the chuck 810. A semiconductor process using the aforementioned chuck 110, 810 would be described in the following paragraphs.

Referring to FIG. 1, the semiconductor substrate 120, such as a wafer, is provided. Next, a warpage level of the semiconductor substrate 120 is measured. Then, the semiconductor substrate 120 is held by providing at least one vacuum suction according to the warpage level, so that the semiconductor substrate 120 is subject to varied suction intensities. Specifically, the vacuum suction is applied through the holes 112 of the chuck 110. In detail, if the sizes of the holes 112 of the chuck 110 are different, as shown in FIGS. 2, 3, 6 and 7, an identically vacuum suction can be applied through the holes 112, and then the suction intensity provided through the (larger) hole 112 may be greater than that provided through the (smaller) hole 112. On the contrary, if the sizes of the holes 112 of the chuck 110 are the same, as shown in FIGS. 4B and 8, the varied suction intensities can be provided through different holes 112. Furthermore, the warpage level of the semiconductor substrate 120 can be measured before or after placing the semiconductor substrate 120 on the chuck 110.

Since the semiconductor substrate 120 placed on the chuck 110 can undergoes varied suction intensities according to the warpage level thereof, the chuck 110 can maintain the semiconductor substrate 120 to be flat, so that the yield of the sequential process may be increased. For example, after providing vacuum suction to the semiconductor substrate 120 to reduce the warpage level of the semiconductor substrate 120, a treatment process for the semiconductor substrate 120 may be performed. In this embodiment, the treatment process may be a process for forming the layer 130 shown in FIG. 1, or a photolithographic process of the layer 130, such as baking process and exposing process, but the invention is not limited hereto.

In summary, when the semiconductor substrate is placed on the chuck, the semiconductor substrate can be subjected to varied suction intensities through the holes of the chuck according to the warpage level thereof, so that the warpage of the semiconductor substrate can be eliminated. Therefore, the process yield of the semiconductor substrate placed on the chuck can be increased and the uniformity of the layer formed on the semiconductor substrate may be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor process, comprising:
   providing a semiconductor substrate;
   measuring a warpage level of the semiconductor substrate; and
   holding the semiconductor substrate by providing at least one vacuum suction according to the warpage level, so that the semiconductor substrate is subjected to a plurality of varied suction intensities, wherein the semiconductor substrate is held on a chuck having a plurality of holes grouped into a plurality of groups, and the sizes of the holes within different groups are different, wherein the sizes of the holes increase from a center toward an edge of the chuck, and the holes are arranged in a spiral.

2. The semiconductor process of claim 1, wherein the semiconductor substrate is placed on the chunk after measuring the warpage level of the semiconductor substrate.

3. The semiconductor process of claim 1, wherein the semiconductor substrate is placed on the chuck before measuring the warpage level of the semiconductor substrate.

4. The semiconductor process of claim 1, further comprising: performing a treatment process for the semiconductor substrate after providing the vacuum suction.

5. The semiconductor process of claim 4, wherein the treatment process comprises a photolithographic process.

6. The semiconductor process of claim 5, wherein the photolithographic process comprises at least one of coating process, baking process and exposing process.

7. A semiconductor process, comprising:
   providing a semiconductor substrate;
   measuring a warpage level of the semiconductor substrate; and
   holding the semiconductor substrate by providing at least one vacuum suction according to the warpage level, so that the semiconductor substrate is subjected to a plurality of varied suction intensities, wherein the semiconductor substrate is held on a chuck having a plurality of holes grouped into a plurality of groups, and the sizes of the holes within different groups are different, wherein the sizes of the holes decrease from a center toward an edge of the chuck, and the holes are arranged in a spiral.

8. The semiconductor process of claim 7, wherein the semiconductor substrate is placed on the chunk after measuring the warpage level of the semiconductor substrate.

9. The semiconductor process of claim 7, wherein the semiconductor substrate is placed on the chuck before measuring the warpage level of the semiconductor substrate.

10. The semiconductor process of claim 7, further comprising: performing a treatment process for the semiconductor substrate after providing the vacuum suction.

11. The semiconductor process of claim 10, wherein the treatment process comprises a photolithographic process.

12. The semiconductor process of claim 11, wherein the photolithographic process comprises at least one of coating process, baking process and exposing process.

* * * * *